(12) United States Patent
Koike et al.

(10) Patent No.: US 9,123,821 B2
(45) Date of Patent: Sep. 1, 2015

(54) ELECTRODE FOR OXIDE SEMICONDUCTOR, METHOD OF FORMING THE SAME, AND OXIDE SEMICONDUCTOR DEVICE PROVIDED WITH THE ELECTRODE

(71) Applicant: Advanced Interconnect Materials, LLC, Sendai-shi, Miyagi (JP)

(72) Inventors: Junichi Koike, Sendai (JP); Mayumi Naito, Sendai (JP); Pilsang Yun, Sendai (JP); Hideaki Kawakami, Chiba (JP)

(73) Assignee: Advanced Interconnect Materials, LLC, Miyagi (JP)

( * ) Notice: Subject to any disclaimer, the term of this patent is extended or adjusted under 35 U.S.C. 154(b) by 0 days.

(21) Appl. No.: 14/018,625

(22) Filed: Sep. 5, 2013

(65) Prior Publication Data

US 2014/0070207 A1    Mar. 13, 2014

Related U.S. Application Data

(63) Continuation-in-part of application No. PCT/JP2012/056492, filed on Mar. 7, 2012.

(30) Foreign Application Priority Data

Mar. 8, 2011 (JP) ................................. 2011-066676

(51) Int. Cl.
*H01L 33/00* (2010.01)
*H01L 29/786* (2006.01)
(Continued)

(52) U.S. Cl.
CPC ............ *H01L 29/7869* (2013.01); *H01L 29/45* (2013.01); *H01L 29/66742* (2013.01);
(Continued)

(58) Field of Classification Search
CPC ............ H01L 29/7869; H01L 29/4908; H01L 29/78603; H01L 29/66742; H01L 33/42; H01L 33/40; H01L 2933/0016

USPC .......................... 257/43, 88; 438/104, 34, 85
See application file for complete search history.

(56) References Cited

U.S. PATENT DOCUMENTS

2007/0002239 A1    1/2007  Koike
2008/0258143 A1   10/2008  Kim et al.
(Continued)

FOREIGN PATENT DOCUMENTS

JP        2004-163901 A     6/2004
JP        2008-219008 A     9/2008
(Continued)

OTHER PUBLICATIONS

Pilsang Yun et al., "Microstructure Analysis and Electrical Properties of Cu—Mn Electrode for Back-Channel Etching a-IGZO TFT", The 17th International Display Workshops (IDW 2010), Presentation FMC2-3, Proceedings pp. 1873-1876.
(Continued)

*Primary Examiner* — Nikolay Yushin
(74) *Attorney, Agent, or Firm* — Sughrue Mion, PLLC

(57) ABSTRACT

To make it possible to form a metal electrode of low electrical contact resistance on a conductive indium-containing oxide semiconductor layer constituting a device active layer of a thin-film transistor or the like. Between an indium-containing oxide semiconductor layer and a metal electrode layer provided above this layer for passing device operating current, which can reduce indium oxide or the like of the oxide semiconductor layer. A metallic oxide layer and a metal layer are formed using as material a metal film including an easily oxidable metal, and further an indium-rich layer in which reduced indium is accumulated is formed at a boundary between the metallic oxide layer and the metal layer.

17 Claims, 6 Drawing Sheets

(51) Int. Cl.
 *H01L 29/66* (2006.01)
 *H01L 29/45* (2006.01)
 *H01L 33/40* (2010.01)
 *H01L 33/42* (2010.01)

(52) U.S. Cl.
 CPC ........... *H01L29/78618* (2013.01); *H01L 33/40* (2013.01); *H01L 33/42* (2013.01); *H01L 2933/0016* (2013.01)

(56) References Cited

U.S. PATENT DOCUMENTS

| | | |
|---|---|---|
| 2010/0090217 A1 | 4/2010 | Akimoto |
| 2010/0117073 A1 | 5/2010 | Yamazaki et al. |
| 2010/0117074 A1 | 5/2010 | Yamazaki et al. |
| 2011/0084268 A1* | 4/2011 | Yamazaki et al. .............. 257/43 |

FOREIGN PATENT DOCUMENTS

| | | |
|---|---|---|
| JP | 2010-50112 A | 3/2010 |
| JP | 2010-80952 A | 4/2010 |
| JP | 2010-93240 A | 4/2010 |
| JP | 2010-140919 A | 6/2010 |
| JP | 2010-232647 A | 10/2010 |
| JP | 2011-100982 A | 5/2011 |
| JP | 2011-129897 A | 6/2011 |
| WO | 2006/025347 A1 | 3/2006 |

OTHER PUBLICATIONS

Ayumu Sato et al., "Amorphous In—Ga—Zn—O coplanar homojunction thin-film transistor", Applied Physics Letters 2009, 4 pgs, vol. 94.

P.S. Yun et al., "Microstructure analysis of the reaction interface of Cu—Mn/In—Ga—Zn—O films", The Japan Society of Applied Physics and Related Societies 2010, Presentation No. 17a-TL-4.

* cited by examiner

250°C × 1h

3. TLM measurement

ELECTRODE FOR OXIDE SEMICONDUCTOR, METHOD OF FORMING THE SAME, AND OXIDE SEMICONDUCTOR DEVICE PROVIDED WITH THE ELECTRODE

This application is a Continuation in Part of International Application No. PCT/JP2012/056492 filed Mar. 7, 2012 (claiming priority based on Japanese Patent Application No. 2011-066676 filed Mar. 8, 2011), the contents of which are incorporated herein by reference in their entirety.

TECHNICAL FIELD

This invention relates to an electrode for an electrically conductive oxide semiconductor containing indium or the like used to fabricate a thin-film transistor or other oxide semiconductor device, and a method of forming the same.

BACKGROUND ART

Electrically conductive oxide semiconductors have in recent years attracted attention as materials for forming optically transparent, transparent electrodes or an active (channel) layer of thin-film transistors (abbreviation: TFT) or other semiconductor devices (see Patent Documents 1 to 7). Thin-film transistors have been applied to liquid crystal display (abbreviation: LCD) devices and organic electro-luminescent (abbreviation: EL) devices, and utilize an oxide semiconductor as the active channel layer. Moreover, transparent electrodes containing an oxide semiconductor as a component have been applied to display panels such as two-dimensional and three-dimensional display devices, touch panels for mobile communication equipment, and so on.

In order to reduce RC delay of signal transmission, among other purposes, the electrodes and interconnections for oxide semiconductors are formed of metal materials of high electrical conductivity and low electrical resistance. Conventionally, they have been formed from, for example, aluminum (element symbol: Al) or titanium (element symbol: Ti) (see Non-patent document 1), or from molybdenum (element symbol: Mo) (see Non-patent document 1). Further, electrodes and interconnections formed by laminating dissimilar metal layers of alloys of titanium or aluminum and silicon (element symbol: Si) are in use (see Patent Document 1). Recently, a technique has come to be known that forms oxide semiconductor electrodes from copper (element symbol: Cu) which has low electrical resistance (see Patent document 8).

For example, thin-film transistors utilized in liquid crystal display devices (abbreviation: LCD) and the like use copper alloy ohmic electrodes for a source electrode and a drain electrode, along with copper interconnections (see Patent documents 8 and 9). Patent document 10 teaches a technique that uses a copper alloy which has a suitable additive element to Cu and forms a metallic oxide film of the additive element so as to inhibit oxidation of the copper, thereby realizing ohmic electrodes of low electrical contact resistance and copper interconnections of small RC delay. The aforesaid suitable additive element is a metal whose energy of oxide formation is lower than that of copper, and manganese (element symbol: Mn) is given as an example (see Patent document 10).

Non-patent document 3 teaches a technique for forming an electrode made of copper (copper electrode) on a thin-film transistor that uses an electrically conductive oxide semiconductor as an active (channel) layer. Specifically, it is a technique for using copper-manganese (Cu—Mn) alloy to form a copper electrode on a thin-film transistor that uses an amorphous indium-gallium-zinc composite oxide (abbreviation: IGZO) semiconductor layer as the active layer (see Non-patent document 3). It is known that when copper-manganese is used to form a copper electrode on an indium-containing oxide semiconductor like IGZO, a manganese oxide layer is formed at a bonding region of the oxide semiconductor and the copper electrode (see Non-patent document 3).

PRIOR ART DOCUMENTS

Patent Documents

Patent document 1: Japanese unexamined patent publication 2010-140919
Patent document 2: Japanese unexamined patent publication 2010-093240
Patent document 3: Japanese unexamined patent publication 2010-080952
Patent document 4: U.S. patent publication 2008/0258143
Patent document 5: U.S. patent publication 2010/0090217
Patent document 6: U.S. patent publication 2010/0117073
Patent document 7: U.S. patent publication 2010/0117074
Patent document 8: Japanese unexamined patent publication 2010-050112
Patent document 9: Japanese unexamined patent publication 2004-163901
Patent document 10: WO 2006/025347

Non-patent Documents

Non-patent document 1: Pilsang Yun, Junichi Koike, "Microstructure Analysis and Electrical Properties of Cu—Mn Electrode for Back-Channel Etching a-IGZO TFT", The 17th International Display Workshops (IDW' 10) (Dec. 1 to Dec. 3, 2010, Fukuoka City, Japan), Presentation FMC2-3, Proceedings pp1873-1876.

Non-patent document 2: A. Sato et al., Appl. Phys. Lett, 133502 (2009, USA).

Non-patent document 3: P. S. Yun, J. Koike, The 37th Spring Meeting, 2010; The Japan Society of Applied Physics and Related Societies (Mar. 17 to Mar. 20, 2010), Presentation No. 17a-TL-4, "Microstructure analysis of the reaction interface of Cu—Mn/In—Ga—Zn—O films"

DISCLOSURE OF THE INVENTION

Problems to be Solved by the Invention

With the aforesaid prior art of forming a copper electrode by heat-treating a copper-manganese alloy deposited on an oxide semiconductor, a manganese oxide layer is formed between the copper electrode and the oxide semiconductor owing to thermal diffusion of manganese contained in the copper-manganese alloy from inside the alloy to the side of the oxide semiconductor. During the formation of this manganese oxide layer, oxygen liberated from the oxide semiconductor is captured as manganese oxide. Therefore, there remains on the manganese oxide layer a copper layer that is of low oxygen content, namely, that is of low electrical resistance suitable for use as an electrode.

On the other hand, the electrical resistance of manganese oxide is higher than that of metallic manganese. While the electrical resistivity of metallic manganese is $(1.6\times10^{-4}$ ohm·centimeter ($\Omega$·cm) at 20° C.), the electrical resistivity of manganese oxides is consistently higher than such electrical resistivity. Therefore, in order to realize a copper electrode of still lower electrical contact resistance with respect to an oxide semiconductor, it is necessary to innovate a still more novel and advanced structure in configuring the electrode.

The present invention was made in light of the need for a novel and more sophisticated electrode configuration technology for IGZO and other indium-containing oxide semiconductors, and proposes a structure providing a copper electrode for use as an oxide semiconductor electrode with low electrical contact resistance. Concomitantly, its object is to propose an available method of forming the oxide semiconductor electrode and an oxide semiconductor device provided with the oxide semiconductor electrode.

Means for Solving the Problem

Specifically, [1] a first aspect of the present invention is an electrode for an oxide semiconductor comprising: an oxide semiconductor layer comprised of an oxide semiconductor material containing indium (element symbol: In); a metallic oxide layer formed on the oxide semiconductor layer; and a metal electrode layer formed on the metallic oxide layer, wherein a layer (a metal layer) comprised of the metal of the metallic oxide layer is interposed between the metallic oxide layer and the metal electrode layer and a layer in which indium is concentrated (an indium-rich layer) is formed between the metallic oxide layer and the metal layer.

[2] A second aspect of the present invention is an electrode for the oxide semiconductor in addition to the constituent elements of the invention set out in para. [1] above, the metal of the metal layer chemically reduces the oxide semiconductor layer containing indium.

[3] A third aspect of the present invention is an electrode for an oxide semiconductor characterized in that, in addition to the constituent elements of the invention set out in para. [2] above, inside the metal layer a concentration of the metal constituting the metal of the metal layer decreases toward the metallic oxide layer. For example, it is an electrode for an oxide semiconductor characterized in that inside a metal layer comprising titanium, the atomic concentration of titanium monotonously decreases from the surface of the titanium metal layer toward the metallic oxide layer comprising titanium oxide.

[4] A fourth aspect of the present invention is an electrode for an oxide semiconductor characterized in that, in addition to the constituent elements of the invention set out in para. [3] above, inside the metallic oxide layer a concentration of the metal constituting the metallic oxide layer is constant. For example, it is an electrode for an oxide semiconductor characterized in that inside a metallic oxide layer comprising manganese oxide, the atomic concentration of manganese is constant in the depth direction inside the same layer.

[5] A fifth aspect of the present invention is an electrode for an oxide semiconductor characterized in that, in addition to the constituent elements of the invention set out in para. [4] above, inside the metallic oxide layer the concentration of the metal constituting the metallic oxide layer decreases from a boundary with the oxide semiconductor layer toward the middle of the thickness of the oxide semiconductor layer. For example, it is an electrode for an oxide semiconductor characterized in that the atomic concentration of manganese inside a metallic oxide layer comprising manganese oxide monotonously decreases toward the middle of the thickness of, for example, an IGZO oxide semiconductor layer.

[6] A sixth aspect of the present invention is an electrode for an oxide semiconductor characterized in that, in addition to the constituent elements of the invention set out in para. [5] above, the concentration gradient of the metal of the metallic oxide from the boundary with the oxide semiconductor layer toward the middle of the thickness of the oxide semiconductor layer is smaller than the concentration gradient of the metal inside the metal layer toward the metallic oxide layer.

[7] A seventh aspect of the present invention is an electrode for an oxide semiconductor characterized in that, in addition to the constituent elements of the invention set out in para. [6] above, the metal layer is composed of manganese, titanium, aluminum or magnesium.

[8] An eighth aspect of the present invention is an electrode for an oxide semiconductor characterized in that, in addition to the constituent elements of the invention set out in para. [7] above, the metal layer is composed of manganese.

[9] A ninth aspect of the present invention is an electrode for an oxide semiconductor characterized in that, in addition to the constituent elements of the invention set out in any of para. [1] to [8] above, the distribution of indium is symmetric around the middle of the thickness of the oxide semiconductor layer. It is an electrode for an oxide semiconductor characterized in that the atomic concentration of indium varies like the shape of a normal distribution curve taking the middle in terms of the thickness of the oxide semiconductor layer as the center of line-symmetry.

[10] A tenth aspect of the present invention is an electrode for an oxide semiconductor characterized in that, in addition to the constituent elements of the invention set out in para. [9] above, the concentration of indium is maximum at the middle of the thickness of the oxide semiconductor layer.

[11] An eleventh aspect of the present invention is an electrode for an oxide semiconductor characterized in that, in addition to the constituent elements of the invention set out in para. [10] above, the distribution of indium inside the indium-rich layer is symmetric around a boundary between the metal layer and the metallic oxide layer. For example, it is an electrode for an oxide semiconductor characterized in that, taking the boundary as the center of the line symmetry, the atomic concentration of indium exhibits distribution shaped like a normal distribution curve.

[12] A twelfth aspect of the present invention is an electrode for an oxide semiconductor characterized in that, in addition to the constituent elements of the invention set out in para. [11] above, the concentration of indium in the indium-rich layer is maximum at the boundary between the metal layer and the metallic oxide layer.

[13] A thirteenth aspect of the present invention is an electrode for an oxide semiconductor characterized in that, in addition to the constituent elements of the invention set out in para. [12] above, the maximum concentration of indium in the indium-rich layer is greater than the concentration of indium inside the metal layer.

[14] A fourteenth aspect of the present invention is an electrode for an oxide semiconductor characterized in that, in addition to the constituent elements of the invention set out in para. [13] above, the maximum concentration of indium in the indium-rich layer is less than the maximum concentration of indium inside the oxide semiconductor layer.

[15] A fifteenth aspect of the present invention is an electrode for an oxide semiconductor characterized in that, in addition to the constituent elements of the invention set out in para. [14] above, atomic indium is contained inside the indium-rich layer.

[16] A sixteenth aspect of the present invention is the electrode for the oxide semiconductor characterized in that, in addition to the constituent elements of the invention set out in para. [15] above, a compound of the metal constituting the metal layer and indium is contained inside the indium-rich layer. For example, it is an electrode for an oxide semiconductor characterized in that, in the case of a metal layer comprising manganese, it comprises an indium-rich layer containing a manganese-indium compound whose composition is, for example, $Mn_3In$.

[17] A seventeenth aspect of the present invention is a method of forming an electrode for an oxide semiconductor that comprises an oxide semiconductor layer containing indium (element symbol: In), a metallic oxide layer formed on the oxide semiconductor layer, a metal layer formed on the metallic oxide layer, and an electrode layer formed on the metal layer, comprising the steps of:

(1) forming an oxide semiconductor layer including indium;

(2) forming a metal film on the oxide semiconductor layer;

(3) heating the metal film and the oxide semiconductor layer to form a metallic oxide layer by oxidizing a portion of the metal film with oxygen inside the oxide semiconductor layer and to simultaneously form an indium-rich layer in which indium is concentrated between the metallic oxide layer and the metal layer; and (4) forming an electrode layer on the metal layer.

[18] An eighteenth aspect of the present invention is a method of forming an electrode for an oxide semiconductor characterized in that in the step of (2) above the metal layer is formed from manganese (element symbol: Mn), titanium (element symbol: Ti), aluminum (element symbol: Al) or magnesium (Mg).

[19] A nineteenth aspect of the present invention is a method of forming an electrode for an oxide semiconductor characterized in that, in addition to the constituent elements of the invention set out in para. [18]above, the metal layer is composed of manganese.

[20] A twentieth aspect of the present invention is the method of forming the electrode for the oxide semiconductor according to any one of the aspects from seventeenth to nineteenth, wherein the metal film is heat-treated for a period of 15 min to 90 min in a temperature range of 200 ° C. to 300 ° C. under a vacuum pressure of $1\times10^{-2}$ pascal (pressure unit; Pa) or less.

[21] A twenty-first aspect of the present invention is a method of forming an electrode for an oxide semiconductor characterized in that, in addition to the constituent elements of the invention set out in para. [20] above, the heat treatment is performed in vacuum with inert residual gas. It is a method of forming the electrode for the oxide semiconductor characterized in that the heat treatment is performed in a high vacuum in which the main constituent of the residual gas is argon (element symbol: Ar).

[22] A twenty-second aspect of the present invention is an oxide semiconductor device characterized by that the device is provided with the electrode for the oxide semiconductor according to the invention set out in any of [1] to [16] above.

[23] A twenty-third aspect of the present invention is the oxide semiconductor device characterized by that the device is provided with the electrode for the oxide semiconductor formed by the method according to the invention set out in any of [17] to [21] above. For example, it is an oxide semiconductor thin-film transistor (TFT) for use in a touch panel.

[24] A twenty-fourth aspect of the present invention is an oxide semiconductor device characterized by, in addition to the constituent elements of the invention set out in para. [22] or [23] above, comprising the electrode for the oxide semiconductor as an ohmic electrode. For example it is a thin-film transistor (TFT) comprising the electrode for an oxide semiconductor as a source electrode or a drain electrode.

Effect of the Invention

According to the first aspect of the present invention, an oxide semiconductor layer comprised of an oxide semiconductor material containing indium (element symbol: In); a metallic oxide layer formed on the oxide semiconductor layer; and a metal electrode layer formed on the metallic oxide layer, wherein a layer (metal layer) comprised of a metal of the metallic oxide layer is provided between the metallic oxide layer and the electrode layer and a layer in which indium is concentrated (indium-rich layer) is formed between the metallic oxide layer and the metal layer, whereby an electrode that is low in electrical contact resistance with respect to the oxide semiconductor layer is provided.

According to the second aspect of the present invention, the oxide of the oxide semiconductor layer containing indium is constituted from a metal that can chemically reduce, for example, indium oxide (chemical composition formula $In_\alpha O_\beta$, $\alpha$, $\beta>0$) and that itself readily oxidizes, which is effective for easily forming the metallic oxide layer by utilizing oxygen liberated by the reducing action. Concomitantly, the chemical reducing action of the metal generates indium atoms that accumulate in the indium-rich layer, which is effective for providing an indium-rich layer of low electrical resistance. Therefore, it contributes to provide an oxide semiconductor electrode of low electrical contact resistance.

According to the third aspect of the present invention, inside the metal layer the concentration of the metal constituting the metal layer decreases toward the metallic oxide layer, i.e., the metal layer comprises a metal that readily diffuses to produce such a concentration decrease, which enables the readily diffusible metal to easily diffuse to inside the oxide semiconductor layer and, therefore, by appropriately capturing oxygen generated inside the oxide semiconductor layer by the chemical reduction, it is possible to effectively form a diffusion barrier consisting of a metallic oxide layer that prevents infiltration of oxygen into the electrode layer.

According to the fourth aspect of the present invention, the electrode for the oxide semiconductor is constituted using a metallic oxide layer in which the concentration of the metal inside the metallic oxide layer is constant, whereby a metallic oxide layer having a uniform composition in the thickness direction can be obtained to provide a diffusion barrier that is a stable barrier against diffusion of oxygen.

According to the fifth aspect of the present invention, the electrode for the oxide semiconductor is constituted using an oxide semiconductor layer in which the concentration of the metal constituting the metallic oxide layer decreases from the boundary with the oxide semiconductor layer toward the middle of the thickness of the oxide semiconductor layer, whereby loss of electrical conductivity of the oxide semiconductor layer by infiltration of metal can be inhibited to provide an oxide semiconductor electrode of low electrical resistance using an oxide semiconductor layer maintaining good electrical conductivity.

In the sixth aspect of the present invention, the concentration gradient of the metal of the metallic oxide from the boundary with the oxide semiconductor layer toward the middle of the thickness of the oxide semiconductor layer is smaller than the concentration gradient of the metal inside the metal layer toward the metallic oxide layer. In other words, in order to reliably form a compositionally uniform metallic oxide layer, an adequate amount of metal is diffused from the metal layer and the amount of metal diffused from the metallic oxide layer to inside the oxide semiconductor layer is reduced, whereby an oxide semiconductor electrode of low electrical resistance can be constituted using an oxide semiconductor layer maintaining good conductivity.

According to the seventh aspect of the present invention, the metal layer is composed of manganese, titanium, aluminum or magnesium capable of chemically reducing, for example, the indium oxide of the oxide semiconductor layer containing indium, whereby a metallic oxide layer as an oxygen diffusion barrier and an indium-rich layer excellent in electrical conductivity can be effectively provided. For example, the metal layer is constituted of magnesium having a strong ionization tendency, whereby oxygen liberated by the reduction is captured by the reducing action thereof to effectively provide a metallic oxide layer comprising magnesium oxide and an indium-rich layer containing reduced indium. Therefore, an oxide semiconductor electrode of low electrical contact resistance can be provided.

According to the eighth aspect of the present invention, the metal layer is specifically composed of manganese, whereby a metallic oxide layer composed of manganese oxide capable of effectively preventing diffusion of oxygen to the electrode layer is provided. Indium generated by reduction can easily pass through the interior of the metallic oxide layer comprising magnesium oxide. As a result of this, indium is efficiently passed toward the indium-rich layer to provide an indium-rich layer in which indium is accumulated at high concentration. An oxide semiconductor electrode of low electrical contact resistance can therefore be provided.

According to the ninth aspect of the present invention, the electrode for the oxide semiconductor is constituted using an oxide semiconductor layer whose distribution of indium is symmetric around the middle of the thickness of the oxide semiconductor layer, which enables an electrode for the oxide semiconductor to be constituted using an oxide semiconductor layer maintaining good electrical conductivity and is advantageous for obtaining an electrode for an oxide semiconductor of low electrical resistance.

According to the tenth aspect of the present invention, the electrode for the oxide semiconductor is constituted using an oxide semiconductor layer whose concentration of indium is maximum at the middle in terms of the thickness of the oxide semiconductor layer, which enables an electrode for the oxide semiconductor to be constituted using an oxide semiconductor layer maintaining especially good electrical conductivity and is advantageous for obtaining an electrode for an oxide semiconductor of low electrical resistance.

According to the eleventh aspect of the present invention, a structure is adopted in which an indium-rich layer, whose internal distribution of indium is symmetric around a boundary between the metal layer and the metallic oxide layer, is arranged in the region between the metal layer and the metallic oxide layer, whereby the effect of reducing electrical contact resistance between the metal layer and the metallic oxide layer is increased and, by extension, an oxide semiconductor electrode of reduced electrical resistance can be obtained.

According to the twelfth aspect of the present invention, the electrode for the oxide semiconductor is constituted using an indium-rich layer whose concentration of indium is maximum at the boundary between the metallic oxide layer and the metal layer, which especially increases the effect of reducing electrical contact resistance between the metal layer and the metallic oxide layer and, by extension, enables a contribution toward realization of an oxide semiconductor electrode of low electrical resistance.

According to the thirteenth aspect of the present invention, the electrode for the oxide semiconductor is constituted using an indium-rich layer whose maximum concentration of indium is greater than the concentration of indium inside the metal layer, which particularly reduces electrical contact resistance between the metal layer and the metallic oxide layer and, by extension, enables a contribution toward realization of an oxide semiconductor electrode of low electrical resistance.

In the fourteenth aspect of the present invention, the electrode for an oxide semiconductor is constituted using an indium-rich layer whose maximum concentration of indium is less than the maximum concentration of indium inside the oxide semiconductor layer. In other words, a structure is adopted that forms an indium-rich layer capable of reducing electrical contact resistance between the metal layer and the metallic oxide layer while ensuring electrical conductivity by adequately maintaining the indium concentration of the oxide semiconductor layer, which is expedient for obtaining an oxide semiconductor electrode of low electrical resistance.

In the fifteenth aspect of the present invention, the electrode for an oxide semiconductor is constituted using an indium-rich layer containing atomic indium, for example, a concentrated layer comprising metallic indium. As a result, the indium-rich layer can be made a layer of high electrical conductivity and an oxide semiconductor electrode of especially low electrical contact resistance can be provided.

In the sixteenth aspect of the present invention, the electrode for an oxide semiconductor is constituted using an indium-rich layer that internally contains a compound of the metal constituting the metal layer and indium. For example, an electrode for an oxide semiconductor is constituted using an indium-rich layer that is a metal layer comprising manganese and, for example, contains a manganese-indium compound of $Mn_3In$ composition in addition to atomic indium. Specifically, a contribution can be made toward providing an oxide semiconductor electrode of low electrical contact resistance because an intermetallic compound excellent in electrical conductivity is incorporated in the indium-rich layer.

According to the seventeenth aspect of the present invention, in a method of forming an electrode for an oxide semiconductor that includes an oxide semiconductor layer comprising an oxide semiconductor material containing indium, a metallic oxide layer comprising an oxide of a metal and formed on the oxide semiconductor layer, a metal layer comprising a metal and formed on the metallic oxide layer, and an electrode layer comprising a metal and formed on the metal layer, the method heat-treats the metal layer to diffuse metal of the metal layer to inside the oxide semiconductor layer to reduce oxide semiconductor of the oxide semiconductor layer and form the metallic oxide layer, and simultaneously move reduced indium oppositely to the metal layer side to form an indium-rich layer, whereby an electrode for an oxide semiconductor including a metallic oxide layer and an indium-rich layer can be readily formed.

In the eighteenth aspect of the present invention, in the step of (2) above, the metal layer is composed of manganese, titanium aluminum or magnesium (Mg). As a result of this, oxygen generated by reduction of oxide of the oxide semiconductor layer is reliably captured to form the metallic oxide layer, and indium generated by the reduction can be used to stably form the indium-rich layer. Therefore, an oxide semiconductor electrode of low electrical contact resistance can be consistently formed.

In the nineteenth aspect of the present invention, the metal layer is specifically composed of manganese. As a result of this, oxygen generated by reduction of oxide of the oxide semiconductor layer is reliably captured to form a metallic oxide semiconductor layer for preventing infiltration of oxygen into the electrode layer. Further, since the metallic oxide layer comprising manganese can readily pass indium generated by the reduction, it contributes to form an indium-rich layer containing indium at high concentration at the bonding region between the metallic oxide layer and the metal layer. Therefore, an electrode for an oxide semiconductor of low electrical contact resistance can be consistently formed.

In the twentieth aspect of the present invention, the metal film is heat-treated for a period of 15 min to 90 min in a temperature range of 200° C. to 300° C. under a vacuum pressure of $1\times10^{-2}$ pascal (pressure unit; Pa) or less. Advantageously, therefore, a metallic oxide layer comprising an oxide of the metal constituting the metal film and, concomitantly, an electrode for an oxide semiconductor containing an indium-rich layer can be stably formed. In addition, it is possible to contribute to provide an oxide semiconductor layer of good conductivity whose concentration of indium atoms is maximum at the middle in the thickness direction and whose indium atoms are distributed symmetrically in concentration taking the middle as the center.

In the twenty-first aspect of the present invention, the heat treatment is performed in a vacuum whose residual gas is composed mainly of inert gas; for example, heat treatment is performed under a high vacuum whose residual gas is composed mainly of helium, neon, argon or other inert gas. As a result of this coarse roughening of the metal film surface can be prevented during the heat treatment and a metal layer of excellent surface flatness can be formed from the metal film, thereby advantageously enabling an electrode layer of excellent adhesion to be optimally deposited thereon.

In the twenty-second aspect of the present invention, an oxide semiconductor device is constituted using an oxide semiconductor electrode of low electrical contact resistance according to a product aspect of the present invention, thereby configuring an oxide semiconductor device using the electrode for an oxide semiconductor, whereby it is possible, for example, to provide an oxide semiconductor thin-film transistor low in operating power loss and exhibiting highly reliable operation over a long period.

The twenty-third aspect of the present invention configures an oxide semiconductor device using the electrode for the oxide semiconductor formed according to the present invention, thereby providing an oxide semiconductor thin-film transistor (TFT) having an oxide semiconductor electrode of low electrical contact resistance, which is low in RC delay, capable of high-speed operation, and usable, for example, in a touch panel.

In the twenty-fourth aspect of the present invention, an oxide semiconductor device is configured by using the oxide semiconductor electrode of low electrical contact resistance according to the present invention as an ohmic electrode, for example, as a source electrode or a drain electrode, whereby it is possible to provide a thin-film transistor, for example, that is low in loss relative to input device operating power.

BEST MODE FOR CARRYING OUT THE INVENTION

Figure 1:
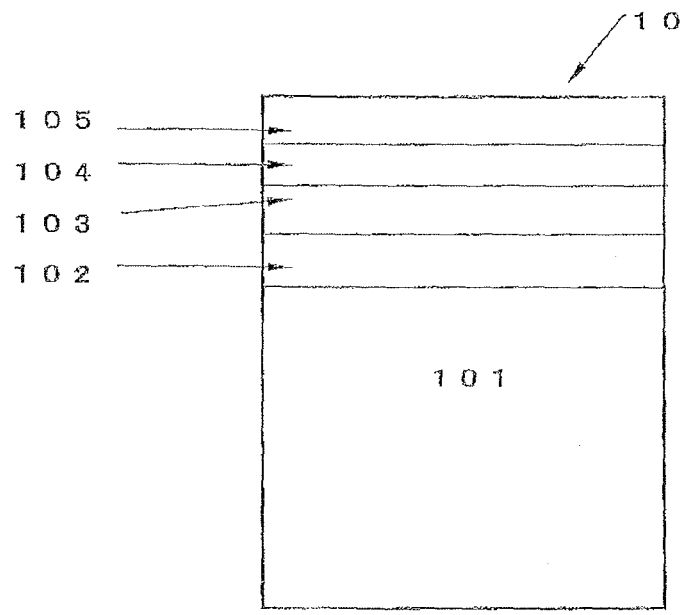
FIG. 1 is a schematic diagram showing the cross-sectional structure of a precursor multilayer structure for configuring an electrode according to the present invention.

FIG. 1 schematically shows a multilayer structure constituting a precursor for obtaining the electrode for an oxide semiconductor of the present invention. The example shown in FIG. 1 is a multilayer structure (10) constituting a precursor in the case of configuring a thin-film transistor source or drain electrode. The constituents included in the precursor multilayer structure (10) are (1) a substrate (101), (2) an insulating film (102) formed on the substrate, (3) an indium-containing oxide semiconductor layer (103) formed on the insulating film (102), (4) a metal film (104) formed on the indium-containing oxide semiconductor layer (103), and an electrode layer (105) formed on the metal film (104).

A silicon substrate, glass substrate or the like is used for the substrate (101). The insulating film (102) formed on the substrate (101) is a film comprising silicon dioxide ($SiO_X$, X>0 and X=2), silicon nitride ($Si_XN_Y$, X, Y>0 and, for example, X=3, Y=4), silicon oxycarbide (SiOC), or other inorganic silicon compound. Otherwise it is an insulating film comprising an organic silicon compound with a methyl group or ethyl group attached. The insulating layer can be formed by the chemical vapor deposition (abbreviation: CVD) method using tetraethoxy silicon (abbreviation: TEOS) as a starting material, the high-frequency sputtering method using $SiO_2$ as a target material, or other physical vapor deposition (abbreviation: PVD) method.

The oxide semiconductor layer (103) is constituted from a high-conductivity oxide semiconductor containing indium as a constituent element. An indium-containing oxide semiconductor having optical transparency in addition to electrical conductivity can be even more suitably utilized in the present invention. Regarding the indium-containing oxide semiconductor, in order to realize high-speed transistor operation, it is desirably constituted from an oxide semiconductor low in electrical resistance and high in mobility. For example, it can be more preferably constituted from $In_XGa_YO$ (0<X≤1, 0<Y<1, X+Y=1) or $In_XZn_ZO$ (0<X≤1, 0<Z<1, X+Z=1) than from aluminum-containing $In_XAl_YO$ (0<X≤1, 0<Y<1, X+Y=1) of relatively high electrical resistance.

Further, it can be more preferably constituted from gallium-indium-zinc composite oxide (abbreviation: IGZO) (chemical composition formula: $In_XGa_YZn_ZO$: 0<X≤1, 0≤Y<1, 0≤Z<1, X+Y+Z=1), which has higher electron mobility than indium-tin composite oxide (abbreviation: ITO) containing tin (element symbol: Sn) as a constituent element. IGZO is defined as a three-element composite oxide composed of a mixture of, for example, indium oxide (chemical composition formula: $In_2O_3$), gallium oxide (chemical composition formula: $Ga_2O_3$) and zinc oxide (chemical composition formula: ZnO) and expressed as $((In_2O_3)_\alpha (Ga_2O_3)_\beta$ $(ZnO)_\gamma$: where α, β and γ represent molar fractions and α+β+γ=1) (see H. Hosono, J. Non-Cryt. Solids, 352 (2006), 851-858). For example, it is $(In_2O_3)_{0.7}$ $(Ga_2O_3)_{0.1}$ $(ZnO)_{0.2}$ complex oxide.

The thickness of the oxide semiconductor layer (103) needs to be defined with consideration to the electrical resistivity of the oxide semiconductor material comprising the layer (103) so as to obtain desired properties. For example, when used as a thin-film transistor channel layer, it is given a thickness adequate for obtaining the desired drain current or anticipated pinch-off voltage. In this invention, as described later, a metallic oxide layer is formed by using the metal film (104) inside the oxide semiconductor layer (103) as a material subjected to heat treatment. Therefore, the thickness of the oxide semiconductor layer in the precursor decreases by an amount corresponding to the thickness of the formed metallic oxide layer. It is therefore essential to form the oxide semiconductor layer thick beforehand so as to ensure adequate thickness for obtaining the desired drain current and anticipated pinch-off voltage even after the metallic oxide layer is formed internally.

The initial thickness of the oxide semiconductor layer (103) is suitably 2 or more times the thickness of the metallic oxide layer (201) formed by the heat treatment. For example, when a 5-nanometer (length unit: nm) thick metallic oxide layer (201) is formed, the thickness of the oxide semiconductor layer (103) is suitably made 10 nm or greater in advance. It is unadvisable to form the metallic oxide layer (201) in a region exceeding ½ the initial thickness of the oxide semiconductor layer (103) on the surface side of the same layer (103). This is because the resulting thinning of the remaining region of the oxide semiconductor layer (103) makes formation of a channel layer with good conductivity difficult.

The thickness of the formed metallic oxide layer is desirably 1 nm or greater. If the thickness is 1 nm or greater, it can serve as an adequate diffusion barrier layer for preventing diffusion and entry of oxygen etc. into the metal layer or electrode layer. On the other hand, since the electrical resistances of metallic oxides are invariably higher than that of an elemental metal layer, the thickness of the metallic oxide layer is advisably made 20 nm or less. When the metallic oxide layer comprises a metal set out below that functions to reduce the oxide semiconductor and is suitable for forming the metallic oxide layer, a disadvantage emerges that the resultant electrode resistance sharply increasing when the thickness of the layer exceeds 20 nm.

The metal film (104) formed on the oxide semiconductor layer (103) is a layer made of a material for forming the metallic oxide layer (201) and a metal layer (202). The metal film (104) is constituted from a metal (represented by symbol Me) that readily chemically reduces indium oxide (e.g., indium oxide represented by the chemical composition formula $In_2O_3$) contained in the oxide semiconductor layer (103). The reaction by the metal Me is, for example, a reducing reaction represented by the following chemical reaction (1).

$$In_\alpha O_\beta \rightarrow In + In_{\alpha-1}O_{\beta-1} + O \text{ (oxygen)} \quad \text{(Chemical reaction 1)}$$

Further, the metal film (104) comprises a metal (Me) more easily oxidized than the metal constituting the metallic oxide predominantly contained in the oxide semiconductor layer (103). Taking an oxide semiconductor layer composed of IZO (abbreviation) as an example, it is formed using a metal (Me) more easily oxidized than the indium that is a constituent element of the same layer. This metal is easily oxidized by the oxygen generated by the chemical reaction (1), according to the following chemical reaction (2).

$$Me + O - (\text{oxidizing reaction}) \rightarrow MeO \text{ (metallic oxide)} \ldots \text{(chemical reaction 2)}$$

The metallic oxide (MeO) formed by the oxidation of the metal (Me) contributes to the formation of the metallic oxide layer (201).

The metal film (104) formed on the oxide semiconductor layer (103) composed of IGZO (abbreviation) or other indium-containing oxide semiconductor is desirably formed of a metal that chemically reduces the oxide semiconductor constituting this oxide semiconductor layer. For example, it is formed using a metal having an action of reducing IGZO. If a metal exhibiting a reducing action on the oxide semiconductor is used, another merit is that the metallic oxide layer can be easily formed. A layer of a metal that causes a reducing action on the oxide semiconductor is formed on the oxide semiconductor layer, and a heat treatment is then performed to promote the reducing reaction. The reducing reaction progresses under the heating and the amount of oxygen liberated by the reduction increases, whereby the metal layer is readily oxidized to easily form the metallic oxide layer.

Owing to this, the metal film is preferably composed of easily oxidizable manganese, titanium, aluminum or magnesium. These are all metals of lower oxide formation enthalpy than indium. In other words, this is because they are metals suitable for efficiently reducing indium predominant in the indium-containing oxide semiconductor layer. Concomitantly, it is because this easy oxidation ability makes them suitable for forming the metallic oxide layer by preferentially capturing oxygen atoms liberated from the indium oxide by the reducing reaction.

In this connection, for magnesium oxide (chemical composition formula: MgO), the standard enthalpy of formation ($\Delta H_f$) of metallic oxide is −(minus) 601.8 KJ/mol. For titanium oxide (chemical composition formula: TiO), it is −519.0 KJ/mol. Further, for manganese dioxide (chemical composition formula: $MnO_2$), it is −519.7 KJ/mol. The $\Delta H_f$ values of these metals are, for example, lower than that of gallium, which has a low $\Delta H_f$ substantially the same as that of the indium among the metal constituent elements constituting the oxide forming the oxide semiconductor layer made of IGZO (abbreviation).

From the aspect of standard enthalpy of formation ($\Delta H_f$) of metallic oxide, magnesium is the most easily oxidized among the foregoing metals. In other words, it is superior in chemically reducing the indium oxide of the oxide semiconductor layer to generate unsaturated oxide of indium ($In_{\alpha-1}O_{\beta-1}$) decreased in atomic indium (In), oxygen (O) and number of bonded oxygen atoms, i.e., increased in number of bonds with oxygen vacancies, by the aforesaid chemical reaction (1). On the other hand, although manganese has a greater $\Delta H_f$ than magnesium, it can form an advantageous metallic oxide layer that passes atomic indium generated by the aforesaid chemical reducing reaction. Therefore, by forming the metal film (104) of manganese and using the manganese film as a material for forming a manganese oxide layer as the metallic oxide layer (201), it is possible later to favorably form an indium-rich layer (203).

The electrode layer (105) that passes device operating current for operating a thin-film transistor, for example, is formed on the metal film (104). The electrode layer (105) should not be formed from a metallic oxide or other material of relatively high electrical resistance but be formed from an alloy or pure metal of low electrical resistance. It is particularly preferably formed from a metal that is low in electrical resistance and more resistant to oxidation than the metal of the metal film (104) that will constitute the metallic oxide layer (201). This is to avoid the metal from being oxidized by intrusion of oxygen generated by the aforesaid reducing reaction (1), which would result in the electrode layer being formed from a metallic oxide of relatively high electrical resistance. For example, the metal film (104) is formed from manganese, and a copper-manganese alloy film or copper film is deposited thereon, and the electrode layer (105) is formed of pure copper (the electrical resistivity of pure copper is $1.6 \times 10^{-6}$ Ω·cm).

Figure 2:
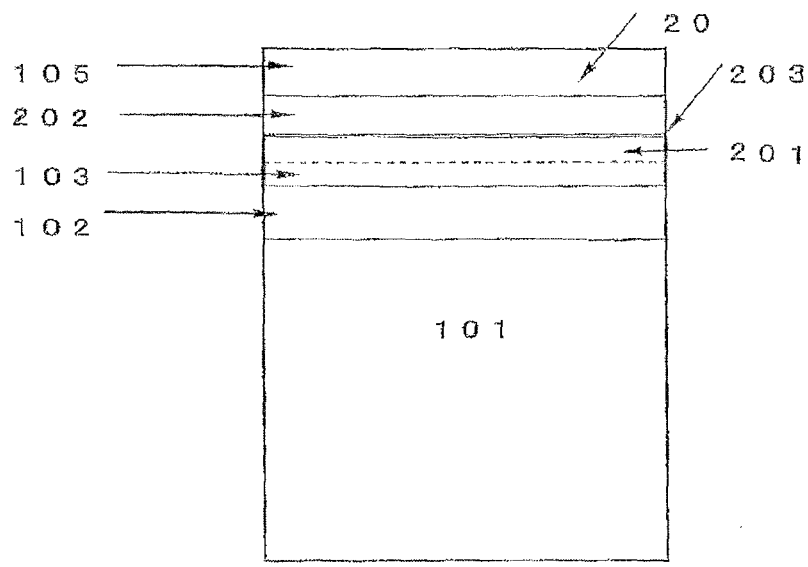
FIG. 2 is a schematic diagram showing the cross-sectional structure of the multilayer structure after performing heat treatment for forming an electrode.

In the present invention, the multilayer structure constituting the precursor is heat treated to form an electrode for an oxide semiconductor that has low electrical contact resistance. FIG. 2 is a schematic diagram showing the cross-sectional structure of a multilayer structure (20) after performing the heat treatment. Constituent elements the same as ones shown in FIG. 1 are assigned the same figure numbers in FIG. 2. In the heat-treated multilayer structure (20) shown in FIG. 2, the characteristic constituent elements are the metallic oxide layer (201) formed from the metal film (104) as material, and the indium-rich layer (203) formed at the bonding region of the metal layer (202), constituted by the remainder of the metal film (104), and the metallic oxide layer (201).

The heat treatment for forming the metallic oxide layer (201) diffuses metal of the metal film ((104) in FIG. 1) into the oxide semiconductor layer (103) to form the metallic oxide layer (201) at an upper region of the oxide semiconductor layer (103) on the side contacting the metal film (104). Further, this heating is preferably performed under a condition that does not diffuse and move all of the metal elements of the oxide semiconductor layer (103) but leaves some of the metal elements without diffusing these. Such heating is adopted because it enables the metal layer (202) to be simultaneously formed from the metal film (104) together with the metallic oxide layer (201).

In the case where the metallic oxide layer (201) is formed inside the oxide semiconductor layer (103) by heat treatment, the thickness of the oxide semiconductor layer (103) decreases by an amount corresponding to the thickness of the metallic oxide layer (201), but the total thickness of the metallic oxide layer (201) and the oxide semiconductor layer (103) remaining even after the heat treatment is little different from the thickness of the oxide semiconductor layer (103) in the precursor. The formation of the metal layer (202) and the metallic oxide layer (201) using a single metal film as the material is one feature brought about by the present invention. When, differently from this, the oxide semiconductor layer and the metallic oxide layer are individually formed, the total thickness of the oxide semiconductor layer and the metallic oxide layer is, only naturally, the total of the two layer thickness.

In addition, the metal layer (201) composed of the remaining metal is preferably heated under a condition for obtaining a polycrystalline layer. This is because a polycrystalline metallic oxide layer (201) is lower in electrical resistance than an amorphous one, so that an electrode for an oxide semiconductor of low electrical contact resistance can be easily obtained. A metallic oxide layer composed of single crystal could be expected to exhibit even lower electrical resistance than a polycrystalline oxide semiconductor layer. However, forming a single-crystal metallic oxide layer in contact with an oxide semiconductor layer, which is generally amorphous, would require heating under a harsh condition. So, to the contrary, a disadvantage might arise of the electrical resistance of the oxide semiconductor layer (103) being increased unnecessarily owing to the escape of indium and so on from the oxide semiconductor layer.

In order to diffuse some of the metal element of the metal film (104) to form the polycrystalline metallic oxide layer (201) at a region on the upper surface side of the oxide semiconductor layer (103) and simultaneously form the metal layer (202) from the remaining undiffused metal, the suitable heat treatment is for a period of 15 min or greater to 90 min or less in a temperature range of 200° C. or greater to 300° C. or less under a vacuum. Heating under in a vacuum of $1 \times 10^{-2}$ Pa or less is particularly suitable.

After forming the metal film (104) and before forming the electrode layer (105), it is possible to conduct heating in the atmosphere of an inert gas, e.g., argon (chemical symbol: Ar), containing oxygen (molecular formula: O2). However, when heating in such an atmosphere is performed after forming the metal film, the metal layer (202) composed of the remaining metal is oxidized to change it into a metallic oxide layer of high electrical resistance, which hinders the formation of an electrode for an oxide semiconductor of a composition imparting low electrical contact resistance. Also in the case where heat treatment is performed in such an atmosphere after forming the electrode layer (105), the metal of the electrode layer (105) is oxidized by the oxygen contained in the atmosphere to constitute an electrode layer (105) from a metallic oxide of high electrical resistance, which hinders formation of an oxide semiconductor electrode given low electrical contact resistance.

The heat treatment in a vacuum taught by the present invention can inhibit the metal layer (202) and the electrode layer (105) from being oxidized irrespective of the time point of the heat treatment. The metal layer (202) can therefore exhibit an effect of acting as a conductive layer that improves passage of the device operating current from the electrode layer (105) to the metallic oxide layer (201). In contrast, another available measure is to heat the metal film (104) in an atmosphere containing oxygen to form the metallic oxide layer (201) by somewhat forcibly oxidizing the entire metal film (104). However, with this technical measure, the metal layer (202) serving to decrease the electrical resistance with respect to the electrode layer (105) needs to be newly provided on the metallic oxide layer (201) after the heat treatment, which complicates the process.

Another merit brought about by the heat treatment taught by the present invention is that the indium-rich layer (203) of higher indium concentration than its neighbors can be formed at the region of bonding to the metal layer (202). The indium-rich layer (203) is formed by local accumulation of indium arriving by passage through the interior of the metallic oxide layer (201) owing to the aforesaid chemical reaction (1).

Figure 3:
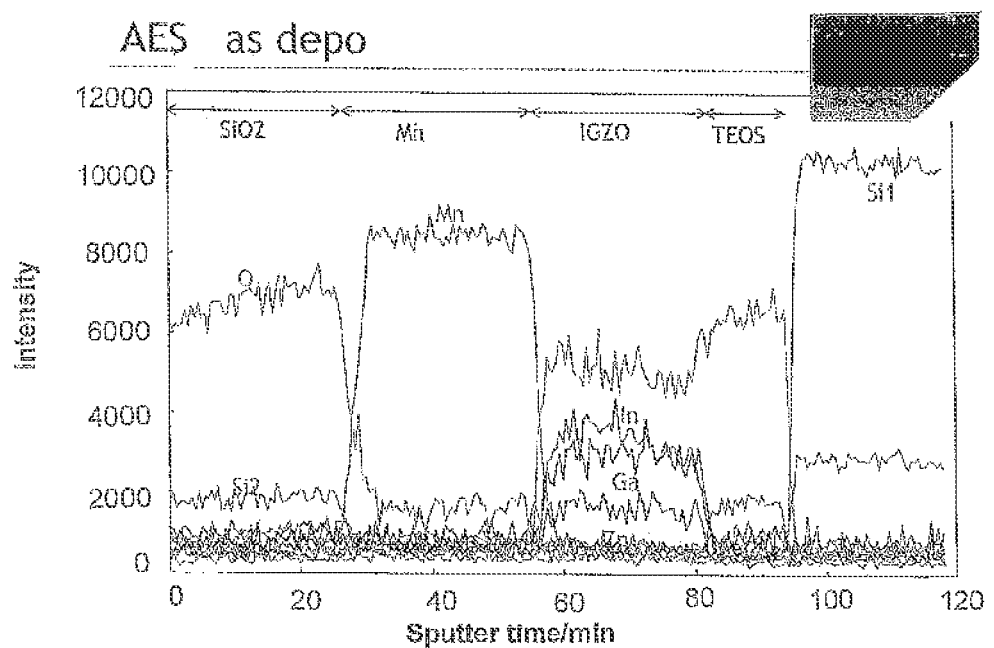
FIG. 3 is an analysis diagram showing the state of element distribution inside the precursor multilayer structure.
Figure 4:
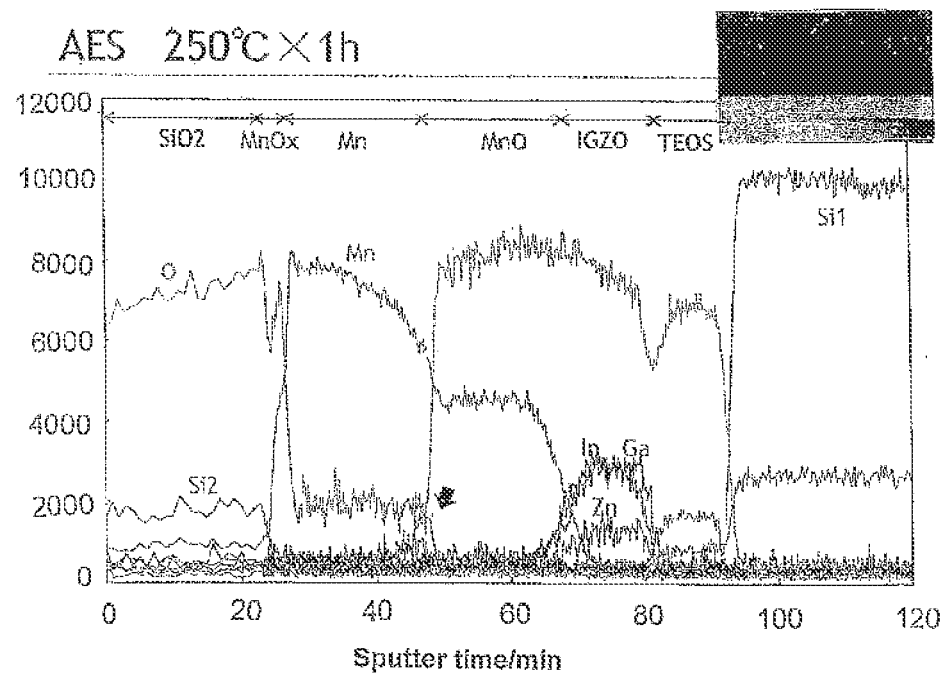
FIG. 4 is an analysis diagram showing the state of element distribution inside the multilayer structure after performing heat treatment for forming an electrode.

The process by which the indium-rich layer (203) is formed will be explained while comparing the state of depth-wise distribution of elements inside the multilayer structure before and after the heat treatment. FIG. 3 and FIG. 4 respectively show the distribution state of elements inside the multilayer structure of the precursor before the heat treatment and inside the multilayer structure after the heat treatment (see figure number 20 of FIG. 2). In order to simplify the element analysis, the multilayer structure of the precursor is, in the case of the multilayer structure indicated by figure number 10 of FIG. 1, the structure with the electrode layer (105) omitted. In the case of the multilayer structure after heat treatment, similarly for the purpose of simplifying the element analysis, the structure is the multilayer structure indicated by figure number 20 of FIG. 2 with the electrode layer (105) omitted.

The insulating layer of the multilayer structure of the precursor was made from silicon oxide (layer thickness=45 nm) formed using TEOS as starting material, the oxide semiconductor layer was formed from IGZO (layer thickness=100 nm), and the metal film (layer thickness=100 nm) comprising the metal to constitute the metal layer and the metallic oxide layer after the heat treatment was formed of manganese. The heat treatment was performed over 1 hour at a temperature of 250° C. under a vacuum pressure of $6.0 \times 10^{-4}$ Pa.

First, the change in atomic concentration of manganese between before and after the heat treatment is examined. The atomic concentration of manganese inside the metal film is substantially constant before the heat treatment (see FIG. 3). After the heat treatment for diffusing manganese into the oxide semiconductor layer, the atomic concentration of manganese inside the metal film decreases monotonously toward the oxide semiconductor layer side. Further, after the heat treatment, a region containing diffused manganese is formed near the surface of the oxide semiconductor layer on the side contacting the diffused metal film. With heating under the aforesaid condition, the region containing manganese extends from the surface of the oxide semiconductor layer (thickness=100 nm) to a depth of about 50 nm, which is equivalent to about one half the thickness of the same layer.

When the composition of this layer is analyzed by selected-area electron diffraction (abbreviation: SED) or other such method, it is found that a metallic oxide layer composed of manganese oxide is formed. This suggests that manganese diffused out of the metal film chemically reduces the indium oxide and the like constituting the oxide semiconductor layer according to the foregoing chemical reaction (1), whereupon the manganese combines with oxygen produced by this reaction to form the metallic oxide layer. Further, this region is characterized in that the atomic concentration of manganese present is substantially constant in the depth direction and that the ratio between the manganese and oxygen atomic concentrations is also substantially constant. From this it is presumed that this region consists mainly of, for example, manganese oxide (chemical composition formula: MnO) or the like whose component ratio of manganese atoms to oxygen atoms is constant.

The metal film composed of the manganese that remains without contributing to the formation of the manganese oxide layer inside the oxide semiconductor layer stays behind as what the present invention calls the metal layer. The feature characterizing the metal layer composed of the metal film used also as material for forming the metallic oxide layer is that, as pointed out above, the internal atomic concentration of metal decreases monotonously toward the oxide semiconductor layer (see FIG. 4).

Reversely from the manganese or other metal constituting the metal film, which diffuses and moves toward inside the oxide semiconductor layer under the heat treatment, the metal generated when the metallic oxide of the oxide semiconductor layer is reduced by the aforesaid reducing chemical reaction (1) moves to the metal layer side. When the metallic oxide layer, whose role is to surely capture oxygen produced by the reduction reaction and to exert an action of preventing intrusion of oxygen into the metal layer, is formed from a metal that readily passes indium and the like, this is advantageous for forming the indium-rich layer. As shown in FIG. 4, formation of the metallic oxide layer from manganese oxide promotes to form the indium-rich layer containing locally accumulated indium at the bonding region between the metal layer and the metallic oxide layer.

It is surmised that movement is mostly to the indium generated in the region where the reducing reaction occurs. Even after the heat treatment, the oxide semiconductor layer remains as is underneath the region where the metallic oxide layer is formed inside the oxide semiconductor layer. The atomic concentration of indium is maximum at the middle of this remaining region. On the other hand, the atomic concentration of manganese decreases monotonously toward the point where the atomic concentration of indium is maximum.

Causing atomic indium to be present in the indium-rich layer is advantageous. Alternatively, it is advantageous to make present an intermetallic compound between metal of the metal layer composed of the remaining metal film and indium. For example, in the case of a metal layer composed of manganese, inclusion of, for example, $Mn_3In$ or other nonstoichiometric intermetallic compound is suitable. Atomic indium, and indium ions and nonstoichiometric indium compounds derived therefrom, are excellent in electrical conductivity. The indium-rich layer including these therefore contributes to reduction of the electrical contact resistance between the metallic oxide layer and the metal layer.

Similarly to inside the remaining oxide semiconductor layer, the indium concentration inside the indium-rich layer is best given symmetrical normal distribution centered on the bonding region between the metal layer and the metallic oxide layer where the concentration is maximum (see FIGS. 3 and 4). In the case where the distribution is asymmetrical with maximum indium concentration shifted toward either the side of the metal layer or the side of the metallic oxide layer, the electrical contact resistance between the metallic oxide layer and the metal layer cannot be favorably reduced. Even if indium is distributed to be maximum in concentration more toward the inside of the metal layer from the aforesaid bonding site, hardly any contribution can be made to reducing the electrical contact resistance between the metal layer and the metallic oxide layer. Above all, it is by distributing indium to have maximum concentration at the bonding site between the metal layer and the metallic oxide layer, i.e., where the two layers are in contact, that an effect of reducing the electrical contact resistance between the two layers is achieved.

Further, and of particular note, is that when indium is distributed so that its concentration is maximum inside the metallic oxide layer near the bonding site between the metal layer and the metallic oxide layer, it becomes difficult to consistently obtain a metal film firmly attached to the metallic oxide layer. This is conjectured to be because an indium oxide layer is formed at the region of bonding with the metal layer, with another cause being deterioration of "wetting" property between the indium and the metal of the metal layer. When the heat treatment is performed in an atmosphere containing oxygen, oxygen coming in from this atmosphere promotes oxidation of the indium that is diffusing and moving in from the metal layer side owing to the chemical reducing reaction. Because of this, indium oxide readily forms at the bonding site between the metal layer and the metallic oxide layer, particularly inside the adjacent metallic oxide layer.

Therefore, the heat treatment is preferably performed in an atmosphere not containing oxygen, for example, under a vacuum pressure of $1 \times 10^{-2}$ Pa or less. In addition, it is preferably performed under a high vacuum of $1 \times 10^{-2}$ Pa or less. It is particularly preferably performed under a high vacuum pressure of $1 \times 10^{-2}$ Pa or less with a residual gas of nitrogen (molecular formula: $N_2$) or an inert gas, not of oxygen molecules (molecular formula: $O_2$) or water molecules (molecular formula: $H_2O$). For thoroughly avoiding the metal of the metal layer from being nitrided to form a metal nitride of high electrical resistance, a heat treatment under a high vacuum with an inert gas as the residual gas is preferable. For example, in order to prevent a metal layer formed of titanium from being nitrided into a titanium nitride composition, the heat treatment is performed under a high vacuum having a residual gas whose main constituent is argon (element symbol: Ar). As other inert gases for the residual gas can be mentioned neon (element symbol: Ne) and helium (element symbol: He).

A vacuum atmosphere with inert residual gas can be established by an operation of passing an inert gas, e.g., helium, into a vacuum vessel or the like to be used for the heat treatment to exhaust entrained oxygen and water molecule, then terminating the gas passage, and evacuating to a vacuum. Repeating this charging/vacuumizing operation increases the proportion of the residual gas component occupied by inert gas and thereby helps to establish a vacuum atmosphere whose residual gas component is mostly inert gas.

Further, in order to avoid formation of such an asymmetrical distribution of indium concentration, it is essential for the temperature of the heat treatment to be made 300° C. or less. The aforesaid asymmetrical distribution of indium concentration hardly depends on the indium-containing oxide material of the oxide semiconductor layer but occurs rapidly under heat treatment exceeding 300° C. Heat treatment at a temperature exceeding 320° C., about twice the indium melting point (157° C.), is particularly undesirable because it makes the indium concentration distribution markedly asymmetrical.

The maximum concentration of indium at the middle in the depth direction of the indium-rich layer corresponding to the bonding site between the metal layer and the metallic oxide layer is preferably higher than the indium concentration inside the adjacent metallic oxide layer and metal layer. This is because the higher the maximum indium concentration is, the greater is the effect of decreasing the electrical contact resistance between the metallic oxide layer and the metal layer.

On the other hand, the maximum value of the indium concentration inside the indium-rich layer is desirably lower than the indium concentration inside the oxide semiconductor layer after heat treatment (see FIG. 4). For example, the maximum concentration of indium of the indium-rich layer is desirably around ⅔ that inside the oxide semiconductor layer. The maximum concentration of indium should be higher in the indium-rich layer than in the oxide semiconductor layer means that a large amount of the indium of the oxide semiconductor diffuses and moves to the indium-rich layer by the heat treatment. Owing to the heavy diffusion of indium, the remaining oxide semiconductor layer loses electrical conductivity to become an oxide layer with high electrical resistance. Such oxide semiconductor layer having acquired high resistance is fundamentally disadvantageous for realizing an oxide semiconductor electrode with low electrical resistance.

The main cause is performing the heat treatment under a condition that accelerates the chemical reducing reaction of the oxide semiconductor vigorously by the metal of the metal layer or the metallic oxide layer. In order to maintain the electrical conductivity of the oxide semiconductor layer high by maintaining the maximum indium concentration inside the same layer higher than that of the indium-rich layer, the heat treatment must, after all, be performed under a limited condition. Specifically, the heat treatment is preferably performed for a period of 15 min or greater to 90 min or less at a temperature of 200° C. or greater to 300° C. or less in the aforesaid high vacuum.

Under a low temperature below 200° C., no substantial diffusion of the metal of the metal layer occurs, nor is the metallic oxide layer formed with adequate stability. What is more, the chemical reducing reaction of the indium oxide of the oxide semiconductor layer is scarcely promoted and, basically, indium for forming the indium-rich layer cannot be efficiently generated. On the other hand, under a high temperature exceeding 300° C., the reduction reaction of the indium oxide of the oxide semiconductor layer proceeds markedly, and a large amount of reduced indium moves to form the indium-rich layer. The final result is, therefore, an undesirable situation of the indium concentration inside the oxide semiconductor layer declining and, to the contrary, the indium concentration of the indium-rich layer growing high.

The heat treatment time is made shorter with increasing heat treatment temperature. Further, good results are obtained by making the time longer with decreasing temperature. In the case of a heat treatment at a temperature in the range of 200° C. or greater to 300° C. or less, a treatment time of 15 min or greater is invariably necessary. This is for promoting the chemical reducing reaction of the indium oxide of the oxide semiconductor layer to generate sufficient indium to form the indium-rich layer. In the case of a heat treatment of longer than 90 min, diffusion of the reduced indium is needlessly promoted, so that an oxide semiconductor layer and an indium-rich layer whose maximum concentrations of indium are in the aforesaid favorable magnitude relationship are not realized with adequate stability.

Further, when the heating time at a temperature in the range of 200° C. or greater to 300° C. or less is limited to not greater than 90 min, coarse roughening of the surface of the metal layer formed from the metal film as the material can be prevented. As a result of this, an electrode layer excellent in adhesion can be advantageously formed on the metal layer formed from the metal film.

The depthwise distribution of the metal element (manganese here) obtained in the case where a favorable heat-treatment condition is established is as exemplified in FIG. 4. As clearly shown in FIG. 4, the manganese atomic concentration declines monotonously from the boundary between the manganese oxide layer and the oxide semiconductor layer toward the middle of the depth direction within the oxide semiconductor layer. Further, it is characterized in elegantly becoming minimum (a low concentration near the analytical detection limit) at the middle of the oxide semiconductor layer where the atomic concentration of indium is maximum. Therefore, owing to indium being favorably distributed to maximize the electrical conductivity of the oxide semiconductor layer at the middle region, the electrical conductivity of the oxide semiconductor layer is presumed to be maintained without loss.

Further, the degree of this decline in the atomic concentration of manganese is smaller than the degree of decline in the atomic concentration of manganese from the metal film (metal layer) in the direction toward the metallic oxide layer. The small degree of decline in the atomic concentration relative to change in film thickness suggests that the chemical reducing reaction of indium oxide and the like proceeds gradually inside the oxide semiconductor layer. When the heat treatment is performed under a harsh condition, the chemical reducing reaction proceeds vigorously, so that manganese appears to be distributed at substantially uniform concentration inside the oxide semiconductor layer. In addition, the distribution of indium at maximum value in terms of concentration comes not to be inside the oxide semiconductor layer, so that the result ends up to be an oxide semiconductor with high electrical resistance.

EXAMPLE EMBODIMENT

The substance of the present invention will be described taking as an example case of forming an ohmic electrode on an indium-containing oxide semiconductor layer composed of IGZO (abbreviation).

Figure 5:
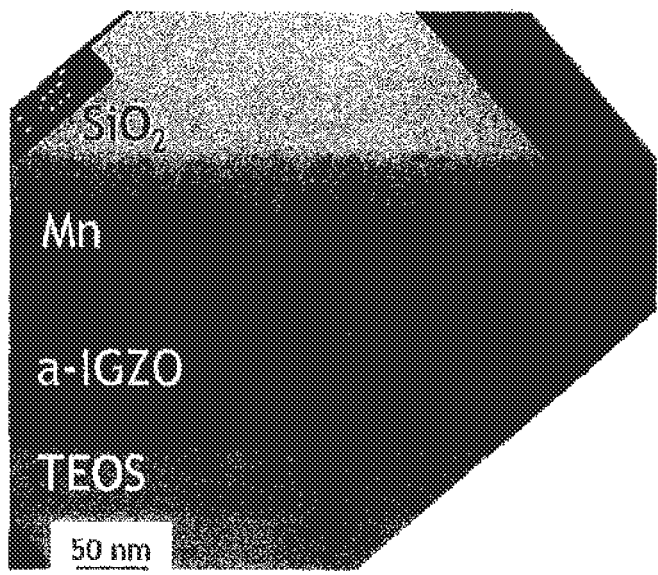
FIG. 5 is a cross-sectional transmission electron micrograph of a part of a multilayer structure described in an embodiment.
Figure 6:
FIG. 6 is a cross-sectional transmission electron micrograph of a part of a multilayer structure after heat treatment described in an embodiment.
Figure 7:
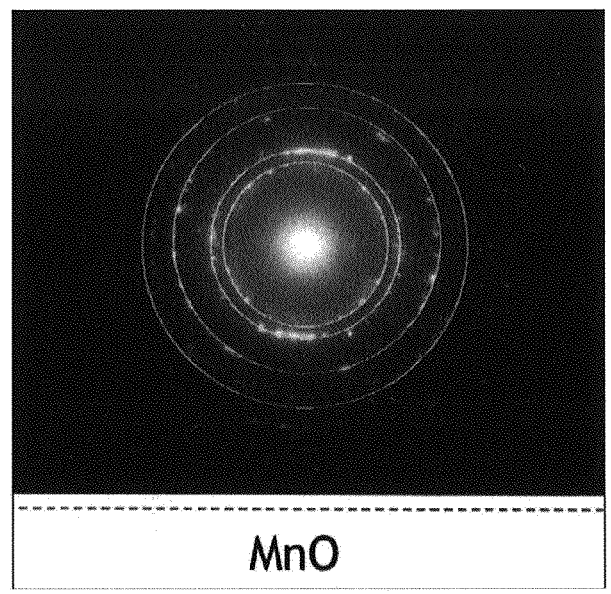
FIG. 7 is a transmission electron diffraction pattern of a metallic oxide layer (manganese oxide layer) of a multilayer structure.
Figure 8:
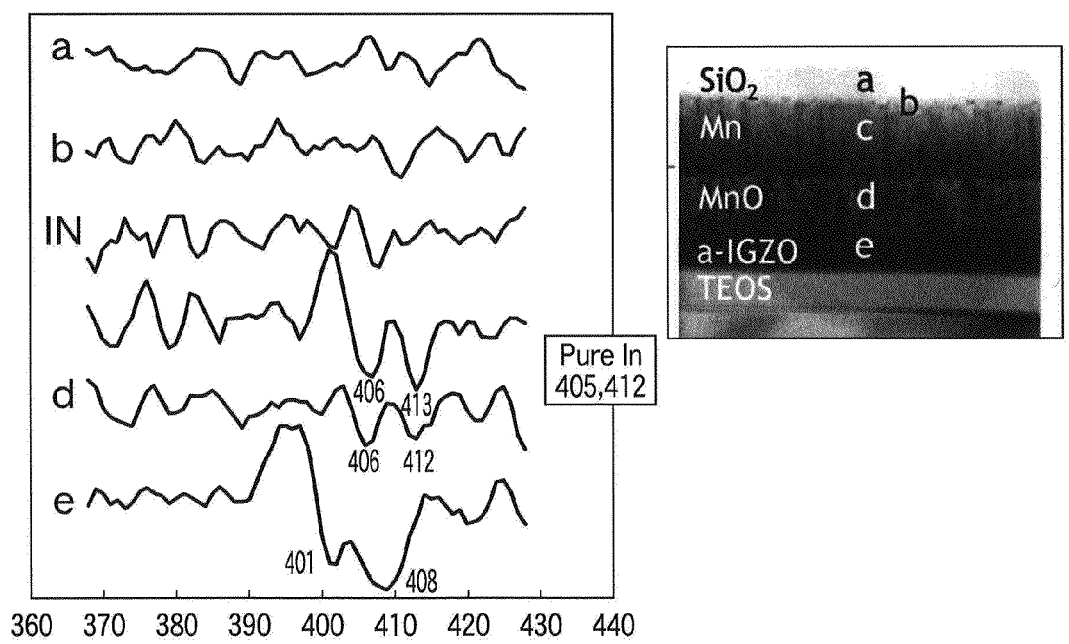
FIG. 8 is an analysis diagram showing the indium bonding state inside an indium-rich layer and surrounding layers.
Figure 9:
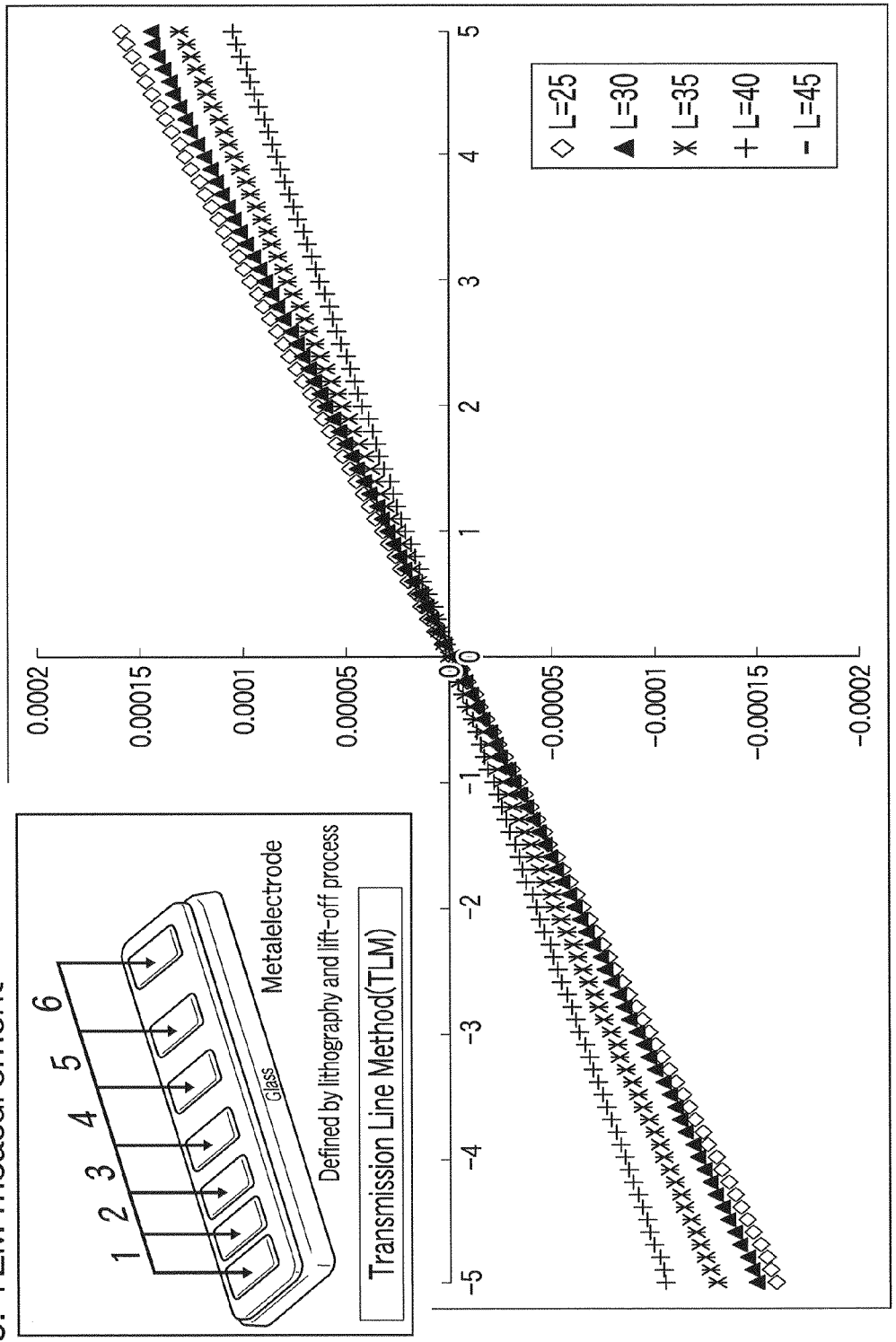
FIG. 9 is a diagram showing current-voltage characteristics of an electrode described in an embodiment.
Figure 10:
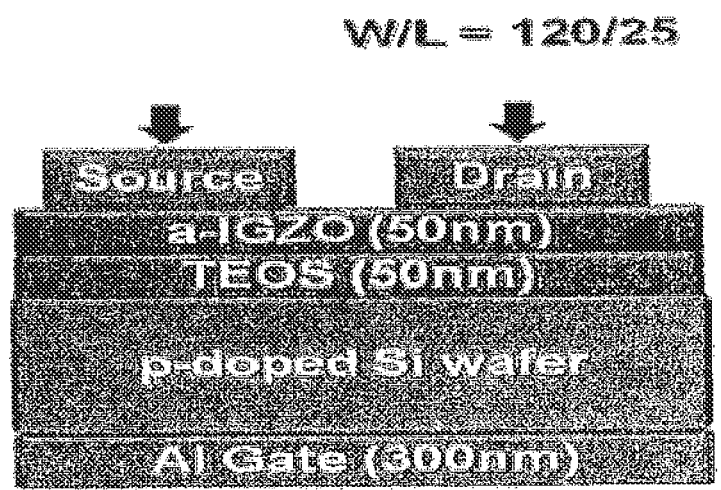
FIG. 10 is a cross-sectional diagram schematically illustrating the structure of a thin-film transistor that can be configured using the electrode for an oxide semiconductor according to the present invention.

FIG. 5 is a cross-sectional transmission electron micrograph (TEM) of a part of a multilayer structure for constituting the electrode described in the present embodiment. FIG. 6 is a cross-sectional TEM of a multilayer structure of the cross-sectional structure shown in FIG. 5 after heat treatment. Note that in FIG. 6 constituent elements the same as those shown in FIG. 5 are assigned the same reference symbols as in FIG. 5. FIG. 7 is a transmission electron diffraction pattern of the metallic oxide layer (manganese oxide layer) formed by the heat treatment. FIG. 8 is a binding energy analysis diagram showing the mode of indium occurrence in the indium-rich layer formed by the heat treatment and the adjacent layers. FIG. 9 is a diagram showing the current-voltage characteristics of the electrode described in the present embodiment.

The multilayer structure shown in FIG. 5 was formed by the following procedure. First, using tetraethoxy silicon (TEOS) as the starting material, a 50-nm thick silicon dioxide ($SiO_2$) insulating film 502 was formed on a p-type conductivity silicon substrate 501.

A 100-nm thick oxide semiconductor layer 503 composed of n-type amorphous gallium-indium-zinc oxide (a-GaInZnO) was deposited on the $SiO_2$ insulating film 502 by an ordinary high-frequency sputtering method. The oxide semiconductor layer 503 was formed by sputtering a target composed of $GaInZnO_4$ oxide in a mixed atmosphere of argon and oxygen (99.5 vol % Ar+0.5 vol % O2) maintained at a pressure of 0.1 Pa. The applied high-frequency power was 50 watt (W), and the deposition rate of the GaInZnO film constituting the oxide semiconductor layer 503 was 18 nm per min. The resistivity of the GaInZnO film was 0.5 Ω·cm or less.

Next, using an ordinary high-frequency sputtering method, a manganese film, called metal film 504 in the present invention and to be used later as the material for forming the metallic oxide layer and metal layer, was deposited on the surface of the oxide semiconductor layer 503. The thickness of the manganese film 504 was 100 nm, the same as the thickness of the oxide semiconductor layer 503.

A $SiO_2$ film 505 (thickness=70 nm) was deposited on the surface of the manganese film 504 as a surface protection film for preventing oxidation of the manganese film 504.

Following the deposition, the depthwise distributions of the manganese and indium atomic concentrations were analyzed by ordinary Auger electron spectroscopy (abbreviation: AES). The analytical results at this point were (1) atomic concentration of manganese inside the manganese film 504 decreases toward the side of the oxide semiconductor layer 503 was not observed, (2) atomic concentration of indium inside the oxide semiconductor layer 503 was uniform in the thickness direction, (3) no evidence was observed of a manganese oxide layer being formed inside the oxide semiconductor layer 503, and (4) no region of locally accumulated indium present at the boundary between the manganese film 504 and the oxide semiconductor layer 503 was found. To sum up, the depthwise atomic concentration distributions of manganese, indium etc. at this time point prior to heat treatment were the same as these shown in FIG. 3.

Next, this multilayer structure 50 was heat treated under a vacuum pressure of $6.0\times10^{-4}$ Pa with argon as the main component of the residual gas. The heating temperature was 250° C. and the heating time was 60 min. After the heat treatment, the temperature of the multilayer structure 50 was cooled to a temperature near room temperature (~25° C.), while maintained under a vacuum of substantially $6.0\times10^{-4}$ Pa in the vacuum vessel used in the heat treatment.

After the cooling, the multilayer structure 50 was taken out of the vacuum vessel used in the heat treatment and examined for structural changes and the like using a transmission electron microscope (TEM). A cross-sectional TEM and the like micrograph showing the cross-sectional structure of the multilayer structure 50 after this heat treatment is shown in FIG. 6. As is clear from the cross-sectional TEM micrograph of FIG. 3, a manganese oxide layer 601 was formed on the surface side of the oxide semiconductor layer 503. The thickness of the manganese oxide layer 601 reached ½ the thickness of the IGZO oxide semiconductor layer 503 before the heat treatment (=100 nm). In other words, the manganese oxide layer 601 was formed as a metallic oxide layer in a region corresponding to ½ the original thickness of the oxide semiconductor layer 503, and the structure changed with the remainder of the oxide semiconductor layer left underneath the metallic oxide layer 601.

As shown in FIG. 4, the atomic concentration of manganese inside the metallic oxide layer 601 formed in the region on the surface side of the oxide semiconductor layer 503 was constant. Further, FIG. 7 is a transmission electron diffraction pattern of the metallic oxide layer 601 taken with an ordinary TEM. The pattern being a Debye diffraction ring speckled with diffraction spots indicates that the metallic oxide layer 601 was a layer composed of polycrystal. Based on the distance between the center of incidence of the incident electron beam and the diffraction ring, the polycrystalline metallic oxide layer 601 was identified to be composed of manganese monoxide (chemical composition formula: MnO). Note that since the diffraction ring is "faint" and unclear at a glance in the electron diffraction screen of FIG. 7, a white circular ring was inserted to trace the circumference of the diffraction ring.

Further, it was found from ordinary AES analysis that the atomic concentration of manganese declined monotonously from the boundary between the metallic oxide layer 601 composed of manganese monoxide and the oxide semiconductor layer 503, toward the middle of the thickness of the remaining oxide semiconductor layer 503 (see FIG. 4). Using analytical conditions under which Auger electron signal intensity increases or decreases lineally in proportion to atomic concentration, the rate of decline in Auger electron intensity of manganese as a function of layer thickness was measured in the region from the metallic oxide layer 601 to the middle of the oxide semiconductor layer 503, where manganese atomic concentration decreased monotonously. The rate of intensity decline averaged 160 per 1 nm change of layer thickness.

Inside the remaining oxide semiconductor layer 503, totally unlike from before the heat treatment, indium concentration exhibited a normal distribution with the maximum concentration at the middle of the thickness of the same layer 503 (see FIG. 4). Gallium similarly exhibited symmetrical concentration distribution inside the remaining IGZO oxide semiconductor layer 503, with the maximum atomic concentration at the middle of the thickness of the same layer. As shown in FIG. 4, the Auger electron intensities corresponding to the maximum concentrations of indium and gallium were substantially the same. No in-depth study was made as to whether the two atomic concentrations were actually nearly the same or the signal strengths just happened to be about the same merely because the detection sensitivity differed between the elements. Although zinc also appears to exhibit a distribution with maximum concentration at the middle of the same layer thickness, as to whether the distribution pattern for zinc was due to the low zinc oxide (ZnO) content of the oxide semiconductor layer 503 in comparison with indium and gallium was not clear.

On the other hand, the thickness of the manganese film used as the metal film 504 serving as the material for forming the metallic oxide layer 601 was not found to decrease appreciably, so that the film remained as a metal layer 602 unchanged from the original thickness. According to ordinary AES analysis, the atomic concentration of manganese decreased monotonously from the surface of the metal layer 602 toward the side of the metallic oxide layer 601, as shown in FIG. 4. Using analytical conditions under which Auger electron signal intensity increases or decreases linearly in proportion to atomic concentration, the rate of decline in Auger electron intensity of manganese as a function of metal layer 602 thickness was measured. The rate of intensity decline averaged 38 per 1 nm change of layer thickness.

The results of AES analysis of indium in the multilayer structure 50 after the heat-treatment showed that a region with accumulated indium had been formed at the boundary between the metallic oxide layer 601 and the metal layer 602 (see FIG. 4). This region with accumulated indium, assigned the designation "indium-rich layer 603," had a thickness of about 10 nm. Also inside the indium-rich layer 603, the atomic concentration of indium exhibited a distribution with the maximum at the middle of the layer thickness.

The mode of existence of the indium accumulated inside the indium-rich layer 603 was investigated by binding energy analysis. FIG. 8 shows an indium binding energy chart for the indium-rich layer 603 and the metallic oxide layer 60 and others, analyzed using AES. In this connection, so far as atomic indium was concerned, very small peaks appeared in the chart at binding energies of 405 electron volt (unit: eV) and 412 eV. The line profile designated by the symbol "IN" in FIG. 8 indicates the binding energy for indium inside the indium-rich layer 603. Small peaks for this indium appeared at binding energies of 405 eV and 413 eV. In other words it was confirmed that the indium contained inside the indium-rich layer 603 is atomic indium.

Further, the binding energy analysis profile of indium contained inside the metallic oxide layer 601 comprising magnesium oxide is designated by the symbol "d" in FIG. 8. As shown by the line profile "d," small peaks representing the binding energy of the indium contained inside the metallic oxide layer 601 appeared at the 406 eV and 412 eV positions. In other words, this is proof that atomic indium was contained in also the metallic oxide layer 601. Atomic indium contained inside the metallic oxide layer 601 in this way is a merit brought about by this metallic oxide layer 601 being constituted of manganese oxide that favorably passes the indium generated by the chemical reduction of the oxide semiconductor layer 503.

On the other hand, the binding energy analysis result for indium contained inside the remaining IGZO indium-rich layer 503 is designated by the symbol "e" in FIG. 8. As shown by the line profile "e," the binding energy of indium inside the same layer 503 is clearly different from those inside the indium-rich layer 603 (see line profile "IN" in FIG. 8) and the metallic oxide layer 602 (see line profile "d" in FIG. 8). The binding energies of indium inside the oxide semiconductor layer 503 were 401 eV and 408 eV. In other words, the binding energies were smaller than the binding energies that can be assumed by atomic indium (405 eV and 412 eV). Since the binding energy of indium shifts to the low value side when indium present in the form of oxide, tit is interpreted that the indium present inside the oxide semiconductor layer 503 have maintained in the oxide form. Therefore this shows that an oxide semiconductor layer of good conductivity remained.

Further, the maximum atomic concentration of indium at the middle of the thickness of the remaining oxide semiconductor layer 503 in terms of Auger electron intensity was $3 \times 10^3$. This Auger signal intensity will be compared with the signal intensity corresponding to the maximum concentration of indium at the middle of the thickness of the indium-rich layer 603 formed at a depthwise location where the atomic concentration of oxygen abruptly decreases from the metallic oxide layer 601 toward the metal layer 602 and the atomic concentration of manganese inside the metal layer 602 changes from a monotonous decline to a constant concentration (see FIG. 4). With the AES analysis conditions set the same as in the case of the oxide semiconductor layer 503, the signal intensity corresponding to the maximum concentration of the indium-rich layer 603 was $3 \times 10^3$. In other words, the signal intensity for the indium of the indium-rich layer 603 was ⅔ relative to that of the oxide semiconductor layer 503. Therefore, a larger amount of indium was left inside the oxide semiconductor layer 503 than was present in the indium-rich layer 603.

Next, an oxide film 505 coating the surface of the metal film 504, that is the surface of the metal layer 602 after the heat treatment, serving as a surface protection film was removed by wet etching. Following this, an electrode layer 604 composed of copper was once formed over the entirely exposed surface of the metal layer 602 by ordinary high-frequency sputtering. The sputtering was performed using a target of high (99.9999%) purity oxygen-free copper. Next, the electrode layer 604 was patterned using known photolithography technology to form parallel flat electrodes differing in interval (L), as shown by the inserted diagram at the upper right of FIG. 8. Although the distance (L) between adjacent electrodes was varied (L=15–50 micrometer (length unit: μm)), the widths (length in direction perpendicular to direction of current flow) and the lengths (length in direction parallel to direction of current flow) of the parallel flat electrodes were unified at 120 μm and 25 μm, respectively. Following the fabrication of the electrodes to such flat shape, direct current was passed between opposing electrodes.

The current (I)—voltage (V) characteristics measured between differently spaced (L) electrodes are shown in FIG. 8. As can be seen from the same diagram, the obtained electrodes exhibited good ohmic characteristics, namely linear current increase even from low applied voltage, irrespective of the size of the electrode interval (L) (L=25–45 μm). Electrical contact resistance was measured by the TLM (Transmission Line Mode) method. Contact resistance at room temperature (about 25° C.) was calculated to be a low value of 0.29 Ω·cm².

INDUSTRIAL APPLICABILITY

The ohmic electrode of copper according to the present invention can be used, for example, as the source or drain electrode of a thin-film transistor having an indium-containing oxide semiconductor as an active layer.

The cross-sectional schematic representation of FIG. 9 exemplifies the structure of a thin-film transistor using low electrical contact resistance electrodes according to the present invention. By way of example, a $SiO_2$ insulating film is formed on the surface of a p-type silicon substrate using TEOS as the material. The thickness of the $SiO_2$ insulating film is, for example, 50 nm. An amorphous IGZO film is formed on the insulating film as an active (channel) layer. The thickness of the IGZO film is, for example, 50 nm. Ohmic electrodes configured to comprise indium-rich layers according to the present invention are formed on the IGZO channel film. The source and drain electrodes are given widths (W: length in direction perpendicular to direction of operating current flow) of 120 μm, for example. The ohmic electrodes are given lengths (length in direction parallel to direction of operating current flow) of 25 μm, for example. A gate electrode of aluminum is formed on the rear surface of the silicon substrate to configure a thin-film transistor.

Further, in the case of a light-emitting diode (LED) having a layer composed of an optically transparent oxide semiconductor for transmitting emitted light to the exterior, the electrode for an oxide semiconductor according to the present invention can be used as an ohmic electrode provided on the oxide semiconductor layer serving as the window thereof. For example, it can be used as an ohmic electrode on the window layer composed of an IGZO film for an LED of p-n junction double heterostructure (DH) configuration using gallium-indium nitride ($Ga_xIn_yN$: $0 \le x, y \le 1$, $x+y=1$) as the light-emitting layer.

DESCRIPTION OF REFERENCE NUMERALS 10 precursor multilayer structure
101 substrate
102 insulating film
103 indium-containing oxide semiconductor layer
104 metal film
105 electrode layer
20 multilayer structure after performing heat treatment
201 metallic oxide layer
202 metal layer
203 indium-rich layer
50 multilayer structure after performing heat treatment
501 silicon substrate
502 silicon dioxide ($SiO_2$) insulating film
503 oxide semiconductor layer
504 metal film
505 protection film for preventing oxidation
602 metal layer
603 indium-rich layer
604 electrode layer

The invention claimed is:

1. An electrode for an oxide semiconductor comprising:
an oxide semiconductor layer comprised of an oxide semiconductor material containing indium (element symbol: In);
a metallic oxide layer formed on the oxide semiconductor layer; and
a metal electrode layer formed on the metallic oxide layer, wherein a metal layer comprised of the metal of the metallic oxide layer is interposed between the metallic oxide layer and the metal electrode layer and a layer in which indium is concentrated (an indium-rich layer) is formed between the metallic oxide layer and the metal layer,
wherein the metal electrode layer is formed from a metal that is more resistant to oxidation than the metal of the metal layer, and
wherein the metal electrode layer is formed of pure copper and the metal layer is formed of manganese.

2. The electrode for the oxide semiconductor according to claim 1, wherein the metal of the metal layer chemically reduces the oxide semiconductor layer containing indium.

3. The electrode for the oxide semiconductor according to claim 2, wherein inside the metal layer a concentration of the metal constituting the metal layer decreases toward the metallic oxide layer.

4. The electrode for the oxide semiconductor according to claim 3, wherein inside the metallic oxide layer a concentration of the metal constituting the metallic oxide layer is constant.

5. The electrode for the oxide semiconductor according to claim 4, wherein inside the oxide semiconductor layer the concentration of the metal constituting the metallic oxide layer decreases from a boundary with the oxide semiconductor layer toward the middle of the thickness of the oxide semiconductor layer.

6. The electrode for the oxide semiconductor according to claim 5, wherein the concentration gradient of the metal of the metallic oxide from the boundary with the oxide semiconductor layer toward the middle of the thickness of the oxide semiconductor layer is smaller than the concentration gradient of the metal inside the metal layer toward the metallic oxide layer.

7. The electrode for the oxide semiconductor according to claim 1, wherein the indium has a distribution which is symmetric around the middle of the thickness of the oxide semiconductor layer.

8. The electrode for the oxide semiconductor according to claim 7, wherein the indium has a concentration which is maximum at the middle of the thickness of the oxide semiconductor layer.

9. The electrode for the oxide semiconductor according to claim 8, wherein the distribution of indium inside the indium-rich layer is symmetric around a boundary between the metal layer and the metallic oxide layer.

10. The electrode for the oxide semiconductor according to claim 9, wherein the concentration of indium in the indium-rich layer is maximum at the boundary between the metal layer and the metallic oxide layer.

11. The electrode for the oxide semiconductor according to claim 10, wherein the maximum concentration of indium in the indium-rich layer is greater than the concentration of indium inside the metal layer.

12. The electrode for the oxide semiconductor according to claim 11, wherein the maximum concentration of indium in the indium-rich layer is less than the maximum concentration of indium inside the oxide semiconductor layer.

13. The electrode for the oxide semiconductor according to claim 12, wherein atomic indium is contained inside the indium-rich layer.

14. The electrode for the oxide semiconductor according to claim 13, wherein a compound of the metal constituting the metal layer and indium is contained inside the indium-rich layer.

15. An oxide semiconductor device provided with the electrode for the oxide semiconductor according to claim 1.

16. The oxide semiconductor device according to claim 15, wherein the electrode for the oxide semiconductor is comprised as an ohmic electrode.

17. An electrode for an oxide semiconductor comprising:
an oxide semiconductor layer comprised of an oxide semiconductor material containing indium (element symbol: In);
a metallic oxide layer formed on the oxide semiconductor layer; and
a metal electrode layer formed on the metallic oxide layer, wherein a metal layer comprised of the metal of the metallic oxide layer is interposed between the metallic oxide layer and the metal electrode layer and a layer in which indium is concentrated (an indium-rich layer) is formed between the metallic oxide layer and the metal layer,
wherein the metal electrode layer is formed from a metal that is more resistant to oxidation than the metal of the metal layer, and
wherein the metal electrode layer is formed of pure copper, and the metal layer is constituted after heat treatment by a remainder of a metal film formed from manganese depositing a copper-manganese alloy film or copper film thereon.

* * * * *